United States Patent [19]
Rathke et al.

[11] Patent Number: 6,046,592
[45] Date of Patent: Apr. 4, 2000

[54] NEAR-ELECTRODE IMAGER

[75] Inventors: Jerome W. Rathke, Lockport; Robert J. Klingler, Westmont, both of Ill.; Klaus Woelk, Wachtberg, Germany; Rex E. Gerald, II, Brookfield, Ill.

[73] Assignee: U.S. Department of Energy, Washington, D.C.

[21] Appl. No.: 09/315,835

[22] Filed: May 21, 1999

[51] Int. Cl.⁷ ............................................. G01V 3/00

[52] U.S. Cl. ................................... 324/321; 324/300

[58] Field of Search ................................ 324/300, 321, 324/318, 322, 307, 309

[56] References Cited

U.S. PATENT DOCUMENTS

| | | | |
|---|---|---|---|
| 5,045,793 | 9/1991 | Rathke | 324/318 |
| 5,757,185 | 5/1998 | Hennig | 324/300 |

*Primary Examiner*—Louis Arana
*Attorney, Agent, or Firm*—Mark P. Dvorscak; Bradley W. Smith; William R. Moser

[57] ABSTRACT

An apparatus, near-electrode imager, for employing nuclear magnetic resonance imaging to provide in situ measurements of electrochemical properties of a sample as a function of distance from a working electrode. The near-electrode imager uses the radio frequency field gradient within a cylindrical toroid cavity resonator to provide high-resolution nuclear magnetic resonance spectral information on electrolyte materials.

19 Claims, 5 Drawing Sheets

NEAR-ELECTRODE IMAGER

CONTRACTUAL ORIGIN OF THE INVENTION

The United States Government has rights in this invention pursuant to Contract No. W-31-109-ENG-38 between the U.S. Department of Energy and the University of Chicago.

BACKGROUND OF THE INVENTION

1. Field of Invention

This invention, a near electrode imager, relates to a near-electrode imager with nuclear magnetic resonance (NMR) sensitivities for providing a direct in-situ analysis of an electrochemical process in order to determine such phenomena as the composition of an electrode-electrolyte interface, ion penetration depths within advanced synthetic electrode materials, and ion concentration gradients within solid state batteries.

2. Description of Related Art

The near-electrode imager provides a direct in situ spectroscopic method to probe the fundamental-ion transport process in advanced battery materials and the detailed chemical composition of the electrode-electrolyte interface. The near-electrode imager uses the radio frequency (RF) gradient within a cylindrical toroid cavity to provide high-resolution nuclear magnetic resonance (NMR) spectral information on electrolyte materials as a function of radial distance from the working electrode of a battery or fuel cell. With a spacial resolution near 1.0 micron, the new imager has resolving power nearly two orders of magnitude higher than conventional MRI while still retaining NMR chemical shift information, which is lost in conventional magnetic resonance imaging (MRI) measurements. The result is a three dimensional plot (or image) of NMR signal intensity and chemical shift versus radial distance from the central working electrode. Significantly, the chemical-shift information allows chemical species to be distinguished from one another. Thus, it becomes possible to follow reaction pathways that may exist in different parts of the cell, most notably at the important electrode-electrolyte interface. In addition, the theoretical spacial resolution of the near-electrode imager is better than possible with MRI because of the stronger gradient that is intrinsic to the torus. Further, spacial resolution with the near-electrode imager is less dependent on the line widths of the NMR signals used in the measurements. This factor is particularly significant for polymer electrolytes (such as those used in lithium-polymer batteries), whose broad NMR lines would limit the resolution of conventional MRI techniques to $\geq 50$ $\mu$m. The high spacial resolution and the ability to retain NMR spectral information combine to make the near-electrode imager nearly ideal for the investigation of fundamental processes in battery and fuel cells. The near-electrode imager provides for the systematic investigation of the fundamental reaction chemistry that has not been previously possible with alternative analysis techniques.

The near-electrode imager provides a direct in situ spectroscopic means to probe the composition of the electrode-electrolyte interface and ion penetration depths within advanced synthetic electrode materials. In addition, the device may be used to investigate the fundamental chemical and physical properties that influence the ion transport mechanisms in the current generation of battery materials. The imaging technique is well suited to measure ion concentration gradients within solid state batteries, diffusion coefficients at different locations in a working cell, conformational dynamics of polymer electrolytes, and changes in phase composition.

This invention relates to an improved method and apparatus for NMR imaging, and in particular, to an apparatus that provides in situ NMR chemical shift, distance, and mobility information for species that are located on, within, and around the electrodes in electrochemical processes. The near-electrode imager provides complete high-resolution nuclear magnetic resonance (NMR) spectra as a function of distance away from the working electrode of a battery or fuel cell. The near-electrode imager utilizes the rotating frame imaging (RFI) method of data collection and the intrinsically strong radio frequency (RF) field gradients produced within toroid cavity resonators to provide spacial resolution near 1.0 micron. Importantly, this imaging technique retains the chemical shift information that is typically sacrificed in conventional MRI measurements. Consequently, the near-electrode imager has the ability to follow reaction pathways because it allows individual chemical species to be distinguished on the basis of their NMR chemical shifts and coupling constants. In addition, the near-electrode imager has been demonstrated to retain the capability to determine spin relaxation mechanisms. This latter capability makes it possible to probe mobilities and the phase composition of polymer electrolytes in the electrolyte depletion zones that form adjacent to the electrodes during normal battery operation. The near-electrode imager can examine ion concentration gradients in working electrochemical cells.

The imager system provides for a toroid cavity nuclear magnetic resonance (NMR) detector capable of quantitatively recording radial concentration profiles, diffusion constants, displacements of charge carriers, and radial profiles of spin-lattice relaxation time constants.

It is the object of this invention to provide an apparatus for employing nuclear magnetic resonance techniques to materials to provide an analytical profile of phenomena associated with electrochemical and other processes on a real-time basis.

It is a further object of this invention to provide a method of employing the imaging apparatus to investigate the fundamental chemical and physical properties that influence ion transport mechanisms.

It is another object of this invention to provide a method for probing the composition of the electrode-electrolyte interface and ion penetration depths within synthetic electrode materials.

Additional advantages, objects and novel features of the invention will become apparent to those skilled in the art upon examination of the following and by practice of the invention.

SUMMARY OF THE INVENTION

To achieve the foregoing and other advantages, this invention, a near-electrode imager, is an apparatus and method for employing nuclear magnetic resonance (NMR) imaging to provide in situ NMR chemical shift, distance and mobility information for species that are located on, within, and around electrodes in electrochemical processes. The near-electrode imager uses the radio frequency field gradient within a cylindrical toroid cavity to provide high-resolution nuclear magnetic resonance spectral information on electrolyte materials as a function of radial distance from the working electrode of a battery or fuel cell. The near-electrode imager has a resolution of approximately 1.0 micron.

BRIEF DESCRIPTION OF THE DRAWINGS

The present invention is illustrated in the accompanying drawings where.

DETAILED DESCRIPTION OF THE INVENTION

Figure 1:
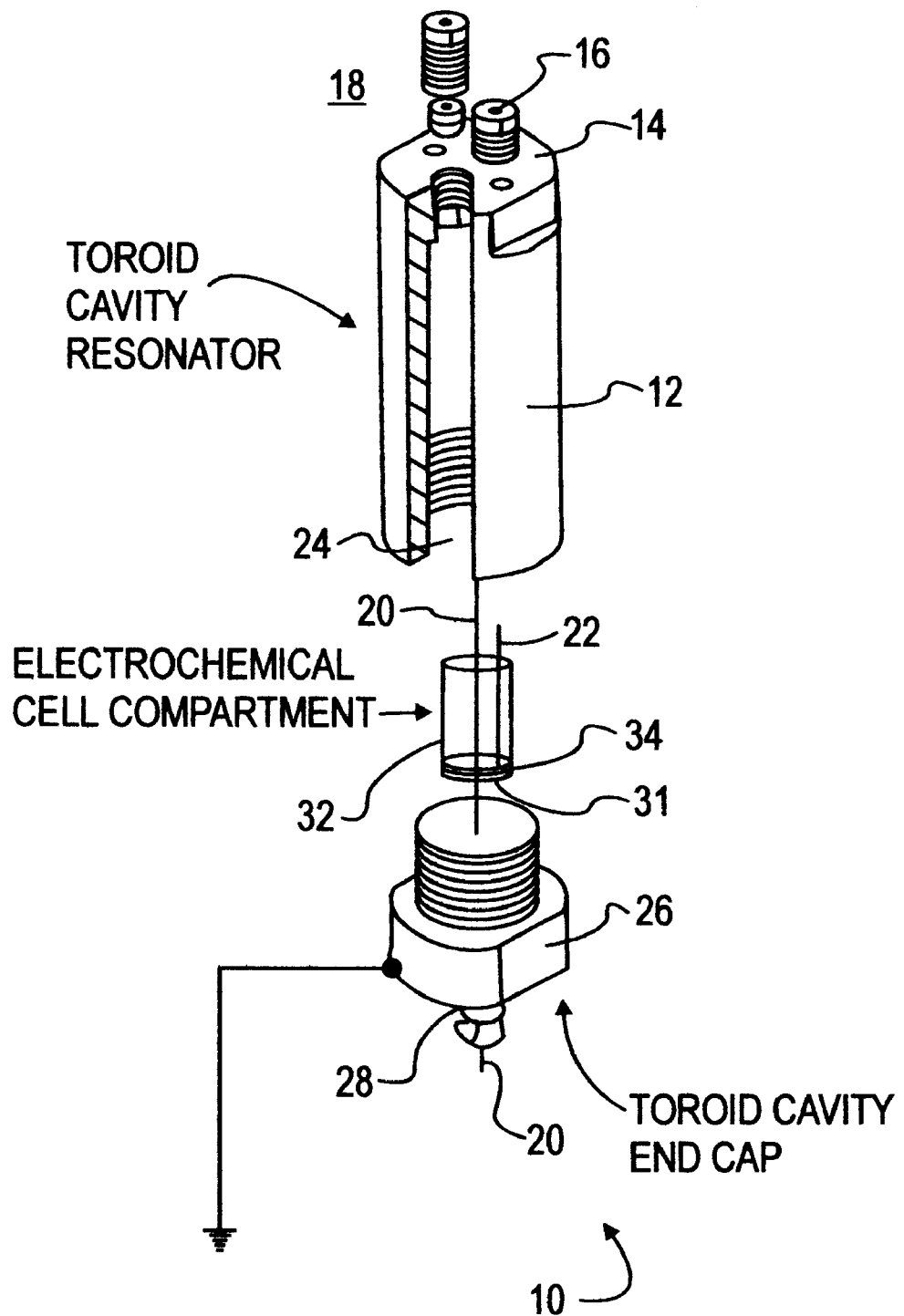
FIG. 1 is an exploded view of the near-electrode imager.

FIG. 1 is an exploded view of the near-electrode imager 10. The toroid cavity 12 is constructed from a material that is a good electrical conductor. In the current embodiment, the toroid cavity is constructed of copper in the form of a hollow cylinder open at one end and closed at the other. The closed end 14 is drilled and tapped to receive two compression fittings 16 and 18 which serve to pass electrodes 20 and 22 to the potentiostat 42 of FIG. 2. The open end of the toroid cavity 24 is tapped to receive a similarly threaded toroid cavity end cap 26. The toroid cavity end cap 26 is drilled to receive a single compression fitting 28 which serves to pass the working electrode 20 from the NMR spectrometer 44, FIG. 2 through the toroid cavity end cap to the base 31 of the electrochemical cell compartment 32. The central working electrode 20 of the electrochemical cell 32 then passes through the electrochemical cell 32 to compression fitting 18 and on to the potentiostat 42.

Figure 2:
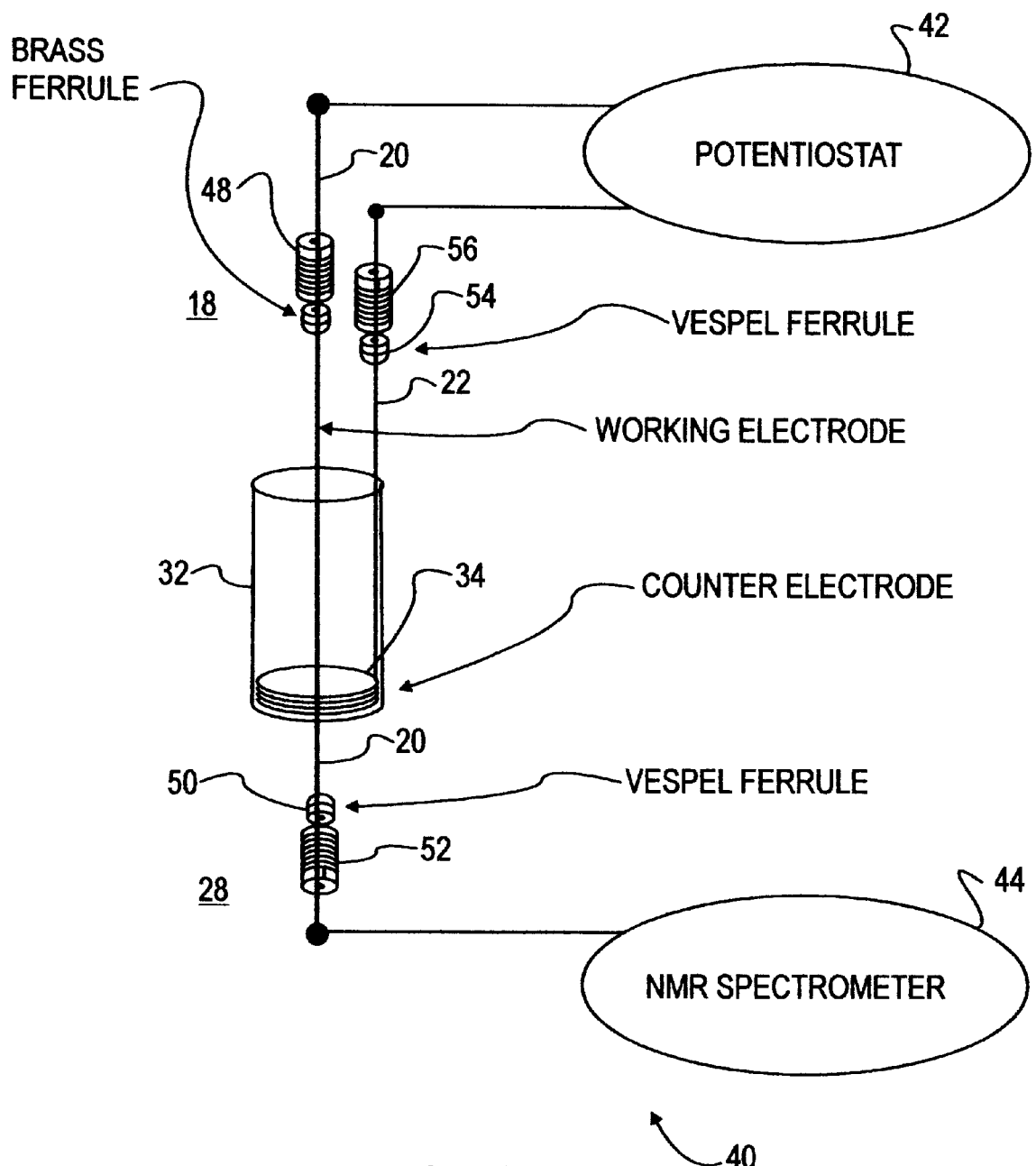
FIG. 2 is an exploded view of the electrochemical cell compartment including the associated electrical connections.
Figure 3:
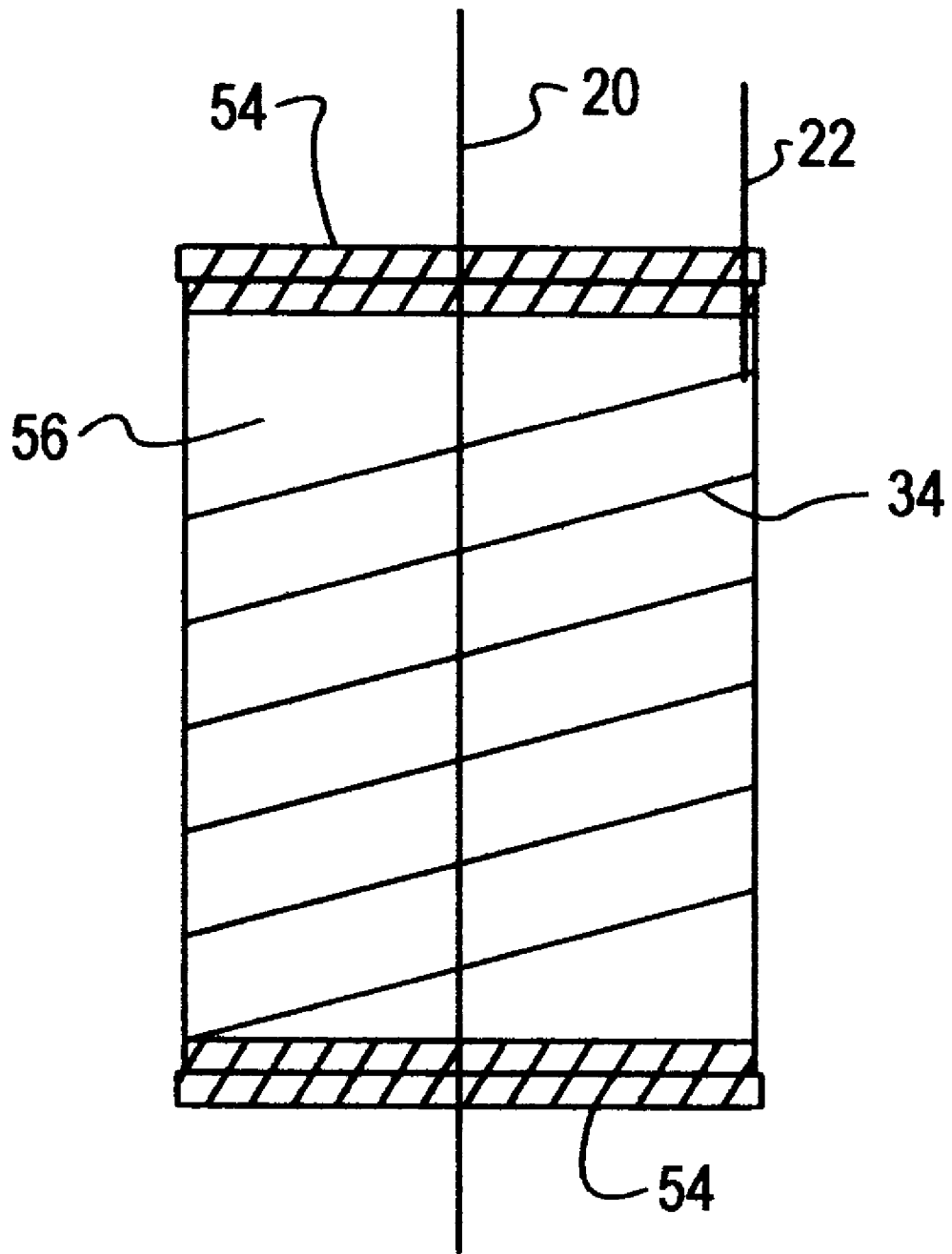
FIG. 3 is an alternate embodiment of the sample containing cell used in the imager.

FIG. 2 illustrates an exploded view of the electrochemical cell in conjunction with the electrical components used to operate the cell and record the response of the sample contained within the cell. The electrochemical cell 32 is positioned within and electrically integrated with the toroid cavity resonator 12, FIG. 1, whereby the central conductor 20 is shared by both the NMR and electrochemical circuits as shown in FIGS. 1 and 2. In one embodiment, the electrochemical cell 32 consists of a cylindrically shaped glass container, as shown in FIGS. 1 and 2, closed at one end except for a opening to allow for the passage of the working electrode 20. In another embodiment, FIG. 3, the cell is formed from a glass tube 52 which is sealed at both ends by means of rubber septa, 54. The working electrode 20 passes through holes in both septa. In both illustrated embodiments, the working electrode 20 is coincident with the major axis of the electrochemical cell compartment represented by the closed-end glass cylinder 32 and the tube 56. A counter electrode 34 which consists of a cylindrical solenoid coil which is positioned so that it is symmetrical about the central working electrode 20, interior to the cell, and positioned either at the base of the cylinder or expanded along the walls of the cell as is shown in FIGS. 1,2 and 3. The compression fitting 18 through which the central working electrode 20 passes as it exits the closed end of the toroid cavity resonator 12 employs a an electrically conducting brass ferrule 46 in conjunction with a hollow threaded fastener 48 which screws into a similarly threaded receptor in the closed end of the toroid cavity resonator 12. The compression fitting 28 for the portion of the central working electrode which passes through the toroid cavity end cap employs a Vespel® ferrule 50 in conjunction with a hollow, threaded fastener 52 which screws into a similarly threaded receptor in the base of the toroid cavity end cap 26. The Vespel® ferrules are used to electrically insulate the electrodes from the conducting toroid cavity resonator and the toroid cavity end cap whereas the brass ferrule electrically couples the electrode to toroid cavity resonator. The counter electrode connector 22 electrically couples the counter electrode coil 34 to the potentiostat 42; in doing so, the connector 22 transverses the closed end of the toroid cavity resonator 12 through a compression fitting 16. The compression fitting employs an electrically insulating Vespel® Ferrule 54 and a hollow threaded fastener 56 which screws into a similarly threaded receptor in the resonator 12. The connector 22 is connected to a potentiostat 42.

The combination of an electrochemical cell compartment 32 with the toroid cavity NMR detector allows for the measurement of macroscopic transport properties, local dynamics, and chemistry of ions as a function of distance from the electrode. In operation the electrochemical cell compartment 32 is filled to a height so as to cover the counter electrode 34 with a sample electrolyte containing an electroactive substrate. Voltages applied across the working and counter electrodes by means of the external potentiostat 42 effect changes in the chemical composition adjacent to the working electrode within the electrochemical cell compartment 32. The NMR spectrometer 44 records the response of the sample to the applied magnetic field generated by the toroid cavity 12. The near-electrode imager is externally tuned to the NMR frequency of interest using circuitry within the NMR spectrometer 44. The resulting data is processed using the rotating frame imaging (RFI) method to produce plots of the NMR signal intensity and chemical shift versus the radial distance from the central working electrode.

In one example the one-dimensional radial concentration profiles of ions solvated in a polyethylene oxide matrix were recorded by $^{19}F$ for several cells. A sequence of $^{19}F$ NMR images, recorded at different stages of cell polarization, revealed the evolution of a region of the polymer depleted of charge carriers. In this case, polyethylene oxide and lithium triflate were dissolved in hot tetrahydrofuran, which was subsequently removed by heating under vacuum. A white solid monolith remained after complete removal of the solvent. The white solid was heated for several minutes at 174° C. in a closed container until the solid melted into a moderately viscous, clear liquid that could be easily handled. The plasticized polymer electrolyte was prepared by mixing the hot liquid ployehtylene oxide polymer electrolyte with tetraglyme, propylene carbonate, and additional lithium triflate salt. The mole ratio of the electrolyte used was $1.000\ LiCF_3SO_3:0.043\ CH_3(OCH_2CH_2)_{91}OCH_3:0.840CH_3(OCH_2CH_2)_4OCH_3:1.682$ propylene carbonate.

A quantity of 1.255 grams of the polymer electrolyte mixture was placed in the electrochemical cell of the toroid cavity NMR detector. The cylindrical cell used was a glass tube having an inside diameter of 10.4 mm and a length of 19.6 mm. Circular rubber septa of diameter 11 mm and thickness of 3 mm were used to seal the tube at both ends. A 0.80 mm diameter gold wire electrode was formed into a 5 turn helix and placed against the inner wall of the glass tube. One end of the wire protruded through the top septum. A 0.62 mm diameter copper wire passed through the center axis of the cell, piercing both septa. A potential was applied across the cell with the negative and positive terminals of the potentiostat connected to the central working electrode and the outer counter electrode respectively. The working electrode of the electrochemical cell assembly also function as the central conductor of the toroid cavity NMR probe.

Fluorine-19 NMR rotating frame images were recorded at room temperature by using a Varian UNITY INOVA- 300WB spectrometer at the following settings: spectrometer frequency, 282.224 MHz; spectral width, 6 kHz; 1024 data points; 4-s recycle delay; four transients per spectrum; 128 spectra recorded with a pulse width increment of 4 $\mu$s (spectral width, 125 kHz). The two-dimensional data sets were processed with 50-Hz line broadening in the F2 and F1 dimensions, respectively. One-dimensional $T_1$ spatial images, which record the spin-lattice relaxation as a function of radial position, required that a composite 180° pulse be executed prior to the acquisition of the normal rotating frame image.

The current vs. time profile of an electrochemical cell subjected to an applied potential is determined by the cell geometry, the equivalents of charge carried by the charge carriers, and the mobility of the charge carriers. Electrochemical cell polarization is the deleterious result of the transport of nonelectroactive ions. In a polarized cell, the charge carriers near the working electrode are depleted to zero, thereby effectively forming an open circuit. In such a case, the cell ceases to function until the charge carriers near the working electrode are replenished by diffusion or other means of mass transport.

Figure 4:
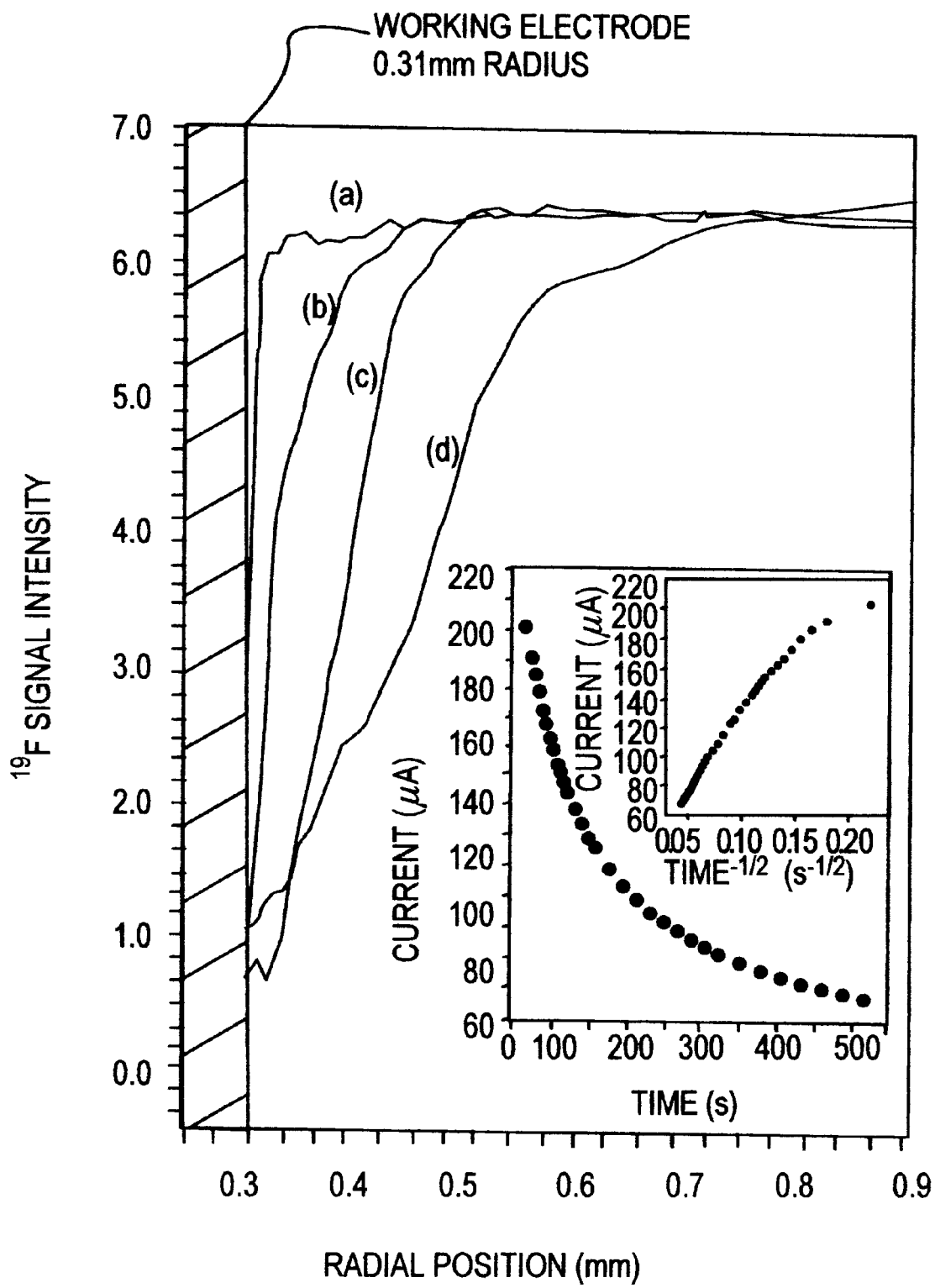
FIG. 4 is a plot of the signal intensity from the sample versus the radial distance from the central electrode.
Figure 5:
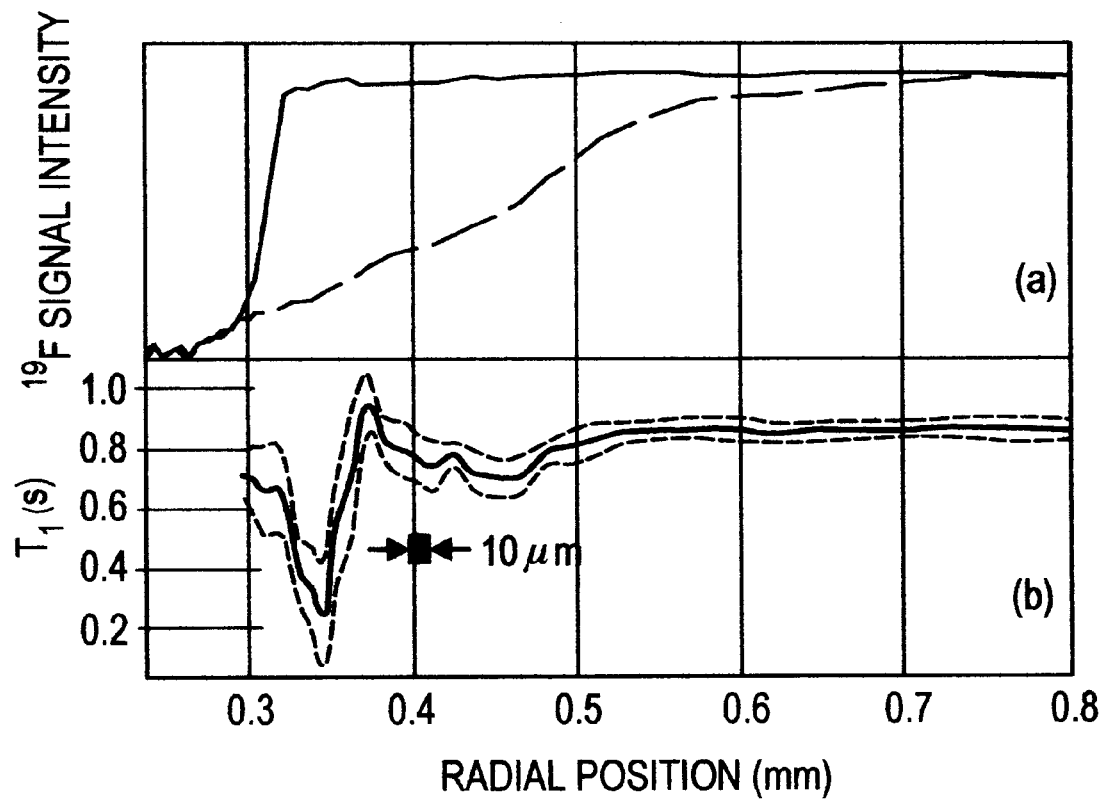
FIG. 5 is a plot of the spin-lattice relaxation time constant of the sample as a function of distance from the working electrode.

The conduction of charge through solid polymer electrolytes in an electrochemical cell can proceed very slowly, requiring an extended period of time to obtain sufficient cell polarization. The electrolyte is used to investigate various aspects of cell polarization including the physical dimensions and profile of the depletion zone, FIG. 4, and the molecular dynamics of the anions through measurements of spatially resolved spin-lattice relaxation time constants, FIG. 4 and 5. In FIG. 4 the dark rectangle on the left side of the plot represents the working electrode having a radius of 0.31 mm. The (a) curve represents the initial profile with (b), (c), and (d) representing the profiles after various periods of charging. The charging current versus time insert occurred between curves (a) and (b). Curve (c) represents the curve after 3.5 h charging at a current which decreases as the square root of the charging time, with the typical charging current varying between 10–40 $\mu$A. Curve (d) was the result of several days charging at the same rate as curve (c). FIG. 5 depicts the spin-lattice Relaxation time constants plotted as a function of the radial distance from the working electrode. The curve suggests that the triflate anions are not entirely depleted in the volume around the working electrode. The solid and dashed lines in curve (a) are the radial profiles of curves (a) and (d) in FIG. 4. The spin relation curve in (b) of FIG. 4 is for the dashed line in (a) of FIG. 5.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiments described explain the principles of the invention and practical applications and should enable others skilled in the art to utilize the invention in various embodiments and with various modifications as are suited to the particular use contemplated. It is intended that the scope of the invention be defined by the claims appended hereto.

The embodiment of this invention in which an exclusive property or privilege is claimed is defined as follows:

1. A near-electrode imager apparatus for in-situ analysis of electrochemical processes through the use of nuclear magnetic resonance said apparatus comprising:

a vessel having an interior chamber, an open end, and a continuous wall and where said vessel is configured to permit a plurality of electrical connectors to pass through the wall;

an end cap where the end cap is constructed to cover the open end of the vessel when in operation and where the end cap is configured to permit passage of an electrical connector;

a sample container for holding a sample to be analyzed where said sample container is positioned in said interior chamber;

a working electrode having a first end and a second end where said first end passes through said end cap, where said second end passes through said vessel wall, where said working electrode is electrically coupled to said vessel wall and where said working electrode passes through said sample container;

a counter electrode having a first end shaped to form a series of coils and a second end which passes through said vessel wall and where said first end is positioned so that it encircles said working electrode.

2. The apparatus of claim 1 where said first end of said working electrode is electrically coupled to a first electrical device and said second end is electrically coupled to a second electrical device.

3. The apparatus of claim 2 where said second end of said counter electrode is electrically coupled to said second electrical device.

4. The apparatus of claim 2 where said first electrical device is a nuclear magnetic resonance spectrometer.

5. The apparatus of claim 3 where said second electrical device is a potentiostat.

6. The apparatus of claim 1 where compression fittings are used to pass electrodes through said end cap and said walls of said vessel.

7. The apparatus of claim 1 where said vessel and said end cap are made of electrically conducting material.

8. The apparatus of claim 7 where said electrically conducting material is copper.

9. The apparatus of claim 1 wherein said vessel is constructed as a hollow cylinder and said open end is threaded.

10. The apparatus of claim 9 wherein said end cap is similarly threaded to said open end and where said end cap screws into said open end of said vessel.

11. The apparatus of claim 6 where a nonconducting ferrule is used for said compression fittings through which said first end of said working electrode and said econd end of said counter electrode pass.

12. The apparatus of claim 6 where a conducting ferrule is used for said compression fitting through which said second end of said working electrode passes.

13. The apparatus of claim 1 where said end cap is electrically grounded as is the nuclear magnetic resonance spectrometer.

14. The apparatus of claim 1 where said counter electrode is symmetric about a major axis of said sample container.

15. The apparatus of claim 14 where said coils of said counter electrode are expanded along said major axis to form a spiral shaped electrode centered around said major axis of said sample container.

16. The apparatus of claim 1 where said sample container is a hollow glass cylinder with rubber or other electrically insulating caps covering either end where said rubber caps have means to feedthrough said working electrode and said counter electrode.

17. The apparatus of claim 1 where said sample container is a hollow cylinder open at one end and having a closed base at another end.

18. The apparatus of claim 1 where said coils of said counter electrode are interior to an inner surface of said sample container.

19. The apparatus of claim 1 where said working electrode coincides with a major axis of said sample container so that said sample container is approximately symmetrical about said working electrode.

* * * * *